United States Patent [19]
Conolly

[11] Patent Number: 6,075,365
[45] Date of Patent: Jun. 13, 2000

[54] MINIMUM COST SOLENOID MAGNET AND METHOD OF MAKING SAME

[75] Inventor: Steven M. Conolly, Menlo Park, Calif.

[73] Assignee: The Board of Trustees of the Leland Stanford Junior University, Palo Alto, Calif.

[21] Appl. No.: 09/063,948

[22] Filed: Apr. 21, 1998

[51] Int. Cl.[7] .................................................. G01V 3/00
[52] U.S. Cl. ............................................ 324/320; 324/309
[58] Field of Search .................................... 324/320, 300, 324/309, 307

[56] References Cited

U.S. PATENT DOCUMENTS

| | | | |
|---|---|---|---|
| 4,906,931 | 3/1990 | Sepponen | 324/309 |
| 5,057,776 | 10/1991 | Macovski | 324/309 |
| 5,629,624 | 5/1997 | Carlson et al. | 324/309 |

*Primary Examiner*—Christine K. Oda
*Assistant Examiner*—Brij B. Shrivastav
*Attorney, Agent, or Firm*—Lumen Intellectual Property Services

[57] ABSTRACT

A method of designing a minimum total annual cost solenoidal electromagnet. The magnets are designed using dimensionless shape ratios $\alpha$ and $\beta$. A quantity of conductor material required for a solenoidal magnet is expressed in terms of $\alpha$ and $\beta$. A cost of the conductor material and cost of magnet fabrication are dependent upon the quantity of conductor material. The conductor material cost is depreciated over a number of years to provide a cost per year of conductor material. Similarly, the power consumption of the magnet results in an annual power cost which is dependent upon power consumption. The power consumption is expressed in terms of $\alpha$ and $\beta$. The power cost and conductor material cost are summed and the resulting total annual cost expression can be minimized by appropriately selecting values for $\alpha$ and $\beta$. Magnets built according to such values of $\alpha$ and $\beta$ will have low total cost (power cost plus material cost). Solenoidal electromagnets according to one embodiment of the present invention have $\alpha\beta \leq 4$, $\alpha \geq 1.1$, and $\beta \geq 0.22$. The present invention also includes a method for reducing the temperature rise rate with a minimal increase in cost of magnets built according to the present invention.

20 Claims, 6 Drawing Sheets

$$\alpha = \frac{a_2}{a_1} \quad \beta = \frac{b}{a_1}$$

Temperature rise rate contour plot for 0.5 Tesla,
19 cm bore magnets

MINIMUM COST SOLENOID MAGNET AND METHOD OF MAKING SAME

This invention was supported in part by grant numbers 2DTA901 and 2DPM568 from the National Institute of Health (NIH). The Government has certain rights in the invention.

FIELD OF THE INVENTION

This invention relates generally to magnetic resonance imaging devices. More particularly it relates to improved electromagnets used in prepolarized magnetic resonance imaging devices.

BACKGROUND OF THE INVENTION

Magnetic resonance imaging (MRI) is a common and well known technique for imaging the internal structure of objects and for medical diagnosis. Conventional MRI requires that the object to be imaged be placed in a uniform (typically to within 40 ppm) and strong (typically in the range of 0.5 to 1.5 Tesla) magnetic field. Generating such magnetic fields is difficult and expensive.

Prepolarized MRI (PMRI) is a recent technique which uses a strong, nonuniform pulsed magnetic field in combination with a weaker, uniform magnetic field to perform imaging. The strong, pulsed field is known as the polarizing field and it is produced by a polarizing magnet. The weaker, uniform field is known as the readout field and is produced by a readout magnet. PMRI is also referred to as switched-field MRI and is related to field cycling nuclear magnetic resonance (NMR) relaxometry.

In PMRI, the polarizing field is switched on briefly (about 0.01 to 2 seconds) to polarize the nuclear spins inside the object to be imaged. Then, the polarizing field is rapidly reduced at a rate faster than the decay rate of the nuclear spin polarization. The nuclear spin polarization is then analyzed in the readout magnetic field. The polarizing field causes the nuclear spin polarization to be greater than it would be with only the readout field. Reference can be made to U.S. Pat. Nos. 5,629,624 to Carlson et al., 4,906,931 to Sepponen, and 5,057,776 to Macovski concerning PMRI.

The polarizing magnet in a PMRI device can be a solenoidal electromagnet. Solenoidal electromagnets can be designed with a particular geometry so as to produce a maximum amount of magnetic field with a minimum amount of electrical power. However, such minimum power solenoidal magnets have several problems. A minimum power solenoidal magnet will have a relatively large material cost due to the large volume of wire required. Also, The inductance/resistance (L/R) time constant will be relatively long, resulting in slower operation of the PMRI device or requiring a more expensive power supply.

A concern with electromagnets is that they heat up during operation. The heat generated during operation limits the length of time that the magnet can be operated.

Another concern with electromagnets is that they are relatively expensive. Magnets represent a significant portion of the cost of a magnetic resonance imaging system.

OBJECTS AND ADVANTAGES OF THE INVENTION

Accordingly, it is a primary object of the present invention to provide solenoidal electromagnets for use in a PMRI device that:

1) have a minimum total cost (depreciated material cost+power cost) for a given desired magnetic field and given bore diameter;
2) have a relatively short L/R time constant compared to minimum power solenoidal electromagnets;
3) are less massive compared to minimum power solenoidal electromagnets;
4) have a minimum amount of temperature rise for a given maximum total cost and desired magnetic field and bore diameter.

It is a further object of the present invention to provide an electromagnet design technique that:

1) minimizes the total cost (depreciated material cost+power cost) for a given desired magnetic field and bore diameter;
2) minimizes the amount of temperature rise for a given desired magnetic field and a given increase in cost above the minimum total cost.

These and other objects and advantages will be apparent upon reading the following description and accompanying drawings.

SUMMARY OF THE INVENTION

The present invention includes prepolarized magnetic resonance imaging devices having a solenoidal polarizing electromagnet with dimensionless shape ratios $\alpha$ and $\beta$ that satisfy the following inequalities:

$$\alpha\beta \leq 4, \alpha \geq 1.1, \text{ and } \beta \geq 0.22.$$

These inequalities define a closed region in $\alpha$-$\beta$ parameter space. Such solenoidal electromagnets have a relatively short L/R time constant compared to minimum power solenoidal magnet designs and have a relatively low total annual cost. Solenoidal polarizing magnets additionally in accordance with $\alpha \leq 3.0$, $\beta \leq 2.2$, $\alpha \geq 1.25$, and/or $\beta \geq 0.3$ are particularly preferred.

The present invention also includes a method of building solenoidal electromagnets. A cost per unit electrical energy per unit time, $C_p$, is defined, a bore radius $a_1$ is selected, a desired magnetic field $B_p$ is selected, and a fill factor $\lambda$ is selected. A conductor material is selected so that a cost per unit conductor material per unit time $C_m$, and a resistivity $\rho$ of the conductor material is determined. Next, a quantity expression for the quantity of conductor material in the solenoidal electromagnet is defined. The quantity expression is proportional to the expression:

$$\lambda a_1^3 \beta(\alpha^2-1).$$

where $\alpha$ and $\beta$ are dimensionless shape ratios to be determined. A total quantity of conductor material, Q, is proportional to the quantity expression. Therefore, the quantity of conductor material is given by:

Quantity of conductor material = $Q \lambda a_1^3 \beta(\alpha^2-1)$

Next, a power consumption expression for the power consumption of the solenoidal electromagnet is defined. The power consumption expression in a solenoidal electromagnet is given by:

$$\text{Power consumption} = P = \left(\frac{\rho}{\lambda}\right)\left(\frac{B_p}{\mu_o}\right)^2 a_1 \left(\frac{1}{G(\alpha,\beta)}\right)^2,$$

where $G(\alpha,\beta)$ is a Fabry factor, $\mu_o$ is the permeability of free space, $\rho$ is the resistivity of the magnet material, $\lambda$ is a fill factor, and $B_p$ is the magnetic field strength. Next, a cost expression is defined. The cost expression is given by:

Total annual cost=$C_m Q + C_p P$, where Q is the quantity of conductive material and P is the power consumption. $C_m$ is a cost coefficient that expresses the depreciated cost per unit of magnet conductor material. $C_p$ is a cost coefficient that expresses the annual cost of electrical power for the magnet. Next, α and β are determined such that the total cost expression is substantially minimized. Finally, a solenoidal electromagnet is built in accordance with the values of α and β and βthe original selected values for the bore diameter and other parameters.

Preferably, α and β are determined by plotting values of the total cost expression for many different values of α and β and defining cost contours.

Preferably, the quantity expression is in terms of mass. In this case, the quantity expression is a mass expression and has the form:

Mass=$M = (2\pi \lambda d) a_1^3 (\alpha^2 - 1)$.

The present invention includes a method of limiting a temperature rise rate of the electromagnet. This is accomplished by defining a maximum temperature rise rate constraint and determining values for α and β such that the total cost expression is substantially minimized given the maximum temperature rise rate constraint.

In the case where the mass expression is used, the total annual cost has the form:

Total annual cost=$C_m M + C_p P$.

That is, the quantity variable, Q, is replaced by the mass variable, M. Of course, the cost coefficient $C_m$, should be in appropriate units of cost per unit mass per unit time.

The present invention includes a method of building a solenoidal electromagnet such that a temperature rise rate experienced by the magnet during operation is constrained to be less than a maximum value. The temperature rise rate is a function of α and β, and so can be plotted in α-β parameter space. A maximum temperature rise rate is defined, and a contour corresponding to the maximum temperature rise rate is plotted in α-β parameter space. The lowest cost magnet design that has a temperature rise rate less than the temperature rise rate of the contour can then be found.

The solenoidal electromagnets according to the present invention can have an annular notch on the inside surface (the surface inside the bore). Such a notch can be designed to render the magnetic field more uniform. Also, the notch can provide a space for a readout coil to be located in the case where the solenoidal magnet is used in a PMRI device.

DESCRIPTION OF THE FIGURES

FIG. 6 illustrates how the temperature rise rate can be minimized with a minimal increase in total annual cost.

DETAILED DESCRIPTION

Figure 1:
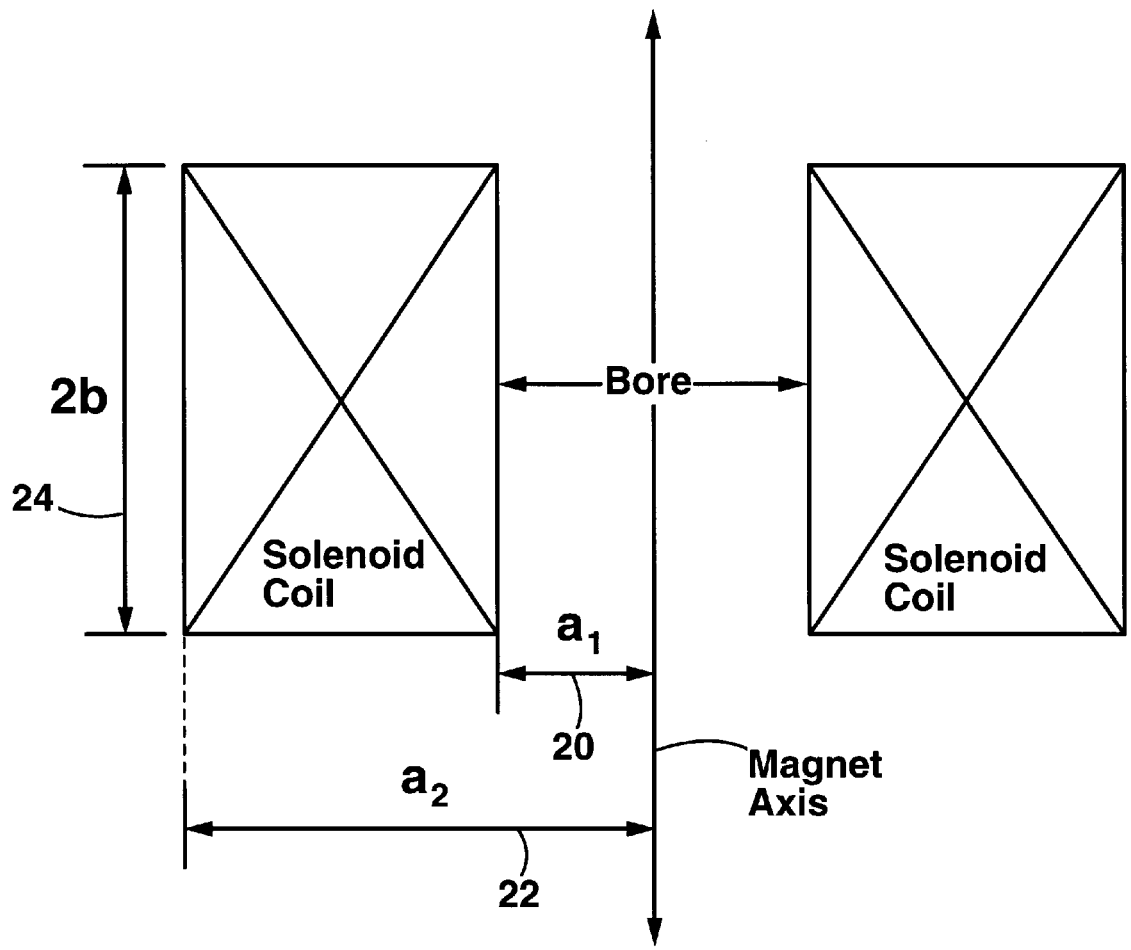
FIG. 1 is a cross sectional side view of a solenoidal electromagnet illustrating how shape ratios α and β are defined.

A cross sectional view of a solenoidal electromagnet is shown in FIG. 1. The (scale-invariant) shape of any solenoidal electromagnet can be defined by two dimensionless shape ratios α and β. α and β are functions of $a_1$ 20, $a_2$ 22, and 2b 24 as follows:

$$\alpha = \frac{a_2}{a_1}, \text{ and } \beta = \frac{b}{a_1}.$$

Since α and β a are dimensionless and completely define the shape of a solenoid, any solenoidal electromagnet having a particular α and β can be uniformly scaled bigger or smaller while maintaining many of the same characteristics. For example, magnetic field uniformity characteristics will be independent of size. Also, power efficiency characteristics will be independent of size. For example, it is known that the unique minimum-power solenoidal electromagnet is defined by α=3 and β=2. In other words, a solenoidal electromagnet with α=3 and β=2 will produce the most magnetic field for the least amount of electrical power.

The dimensionless shape ratios α and β are known in the art. Reference can be made to *Solenoid Magnet Design* by D. B. Montgomery, Robert Krieger Publishing Company, Malabar, Fla. 1980, concerning the dimensionless ratios α and β.

Solenoidal electromagnets with α=3 and β=2 are commonly used because they are power efficient. However, such solenoidal electromagnets are not desirable for many applications such as for providing the polarizing field in a prepolarized MRI (PMRI) device. This is because a α=3, β=2 solenoid has a relatively long inductance/resistance (L/R) time constant. The polarizing magnetic field in a PMRI device must be pulsed during image acquisition. The frequency of the magnetic field pulses determines the imaging speed. The use of a polarizing magnet with a long L/R time constant renders it more difficult to maintain a rapid sequence of magnetic field pulses. The use of a short L/R time constant allows the use of a simple, low cost magnet power supply.

Another problem with α=3, β=2 solenoids is that they require a relatively large amount of wire. Due to the expense of wire materials (i.e. copper wire) and the expense of fabricating solenoids with a large number of windings, the minimum power solenoidal design is quite expensive to build. Since magnets do not last forever, this fabrication cost must be depreciated over a finite number of years. Typically, such costs are depreciated over about five years.

The present invention discloses a method for making solenoidal magnets having minimum total annual cost. The total annual cost is a function of the power costs as well as the depreciated fabrication and material costs. Also, the present invention includes low-cost magnets made by the method.

The quantity of conductor material in a solenoidal magnet in units of mass can be calculated from the following equation:

Mass=$M = (2\pi \lambda d) a_1^3 \beta (\alpha^2 - 1)$, where d is the density of the conductor material, λ is a fill factor, and $a_1$ is the bore radius. The fill factor λ is the ratio of conductor volume to total coil volume. It represents the portion of the solenoidal coil that comprises conductor material. The fill factor is largely determined by the cross sectional shape of the wire used and the thickness of the wire insulation. For example, wire having a square cross sectional shape typically has a fill factor of about 0.95 and wire having a circular cross sectional shape typically has a fill factor of about 0.75.

It is noted that, for the purposes of the present invention, the quantity of conductor material in the solenoidal magnet does not necessarily need to be expressed in units of mass. The quantity of conductor material can be expressed in units of volume, weight or any other equivalent measure. Most generally, the quantity of conductor material can be expressed as a function of only the dimensionless shape ratios $\alpha$ and $\beta$, the fill factor $\lambda$ and the bore radius $a_1$. The quantity of conductor material is given by:

Quantity of conductor material=$Q \lambda a_1^3 \beta(\alpha^2-1)$.

The quantity of conductor material, Q, is proportional to the expression $\lambda a_1^3 \beta(\alpha^2-1)$. It is noted that M and Q are interchangeable with multiplication by an appropriate constant.

Therefore, the following description will be explained in terms of the more general variable Q, and it is understood that M can be substituted for Q, with multiplication by an appropriate constant factor.

The power consumption of a solenoidal coil is given by the following equation:

$$\text{Power consumption} = P = \left(\frac{\rho}{\lambda}\right)\left(\frac{B_p}{\mu_o}\right)^2 a_1 \left(\frac{1}{G(\alpha, \beta)}\right)^2,$$

where $\rho$ is the resistivity of the conductor material, $\lambda$ is the fill factor, $B_p$ is the polarizing magnetic field to be produced, $\mu_o$ is the permeability of free space, $a_1$ is the bore radius and $G(\alpha,\beta)$ is the Fabry factor. In SI units the Fabry factor is given by the following equation:

$$G(\alpha, \beta) = \sqrt{\frac{\beta}{2\pi(\alpha^2-1)}} \left(\sinh^{-1}\left(\frac{\alpha}{\beta}\right) - \sinh^{-1}\left(\frac{1}{\beta}\right)\right).$$

The Fabry factor is known in the art of solenoidal magnet design. Reference can be made to *Solenoid Magnet Design* by D. B. Montgomery, Robert Krieger Publishing Company, Malabar, Fla. 1980, concerning the Fabry factor.

It is an object of the present invention to minimize the total annual cost of a solenoidal electromagnet for a given desired bore radius $a_1$, given desired magnetic field $B_p$, a given fill factor $\lambda$ and given conductor material. The total annual cost is minimized by properly selecting $\alpha$ and $\beta$. It is noted that the field to be produced, $B_p$, is measured in the center of the solenoid, where the flux density is greatest.

The total annual cost of a solenoidal electromagnet is given by the following total annual cost (TAC) expression:

Total annual cost=TAC=$C_p P + C_m Q$.

where P, and Q are the power and quantity expressions defined above, respectively, and $C_p$ and $C_m$ are cost coefficients. $C_p$ is the annual cost per unit of power and $C_m$ is the annual cost per unit quantity of conductor material. $C_m$ is an annual cost because it is depreciated over a predetermined time interval. For example, if copper wire costs $10/kilogram, and it is depreciated over five years, then $C_m$=$2/kilogram-year. All the cost calculations herein presume a five-year depreciation and calculate costs on an annual basis. However, other depreciation intervals can also be used.

The $C_m$ coefficient may also incorporate fabrication costs in addition to conductor material costs since fabrication costs will be approximately proportional to the quantity of conductor material.

The coefficient $C_p$ can be calculated as follows:

$C_p$=(hours of operation/year)×(cost/kilowatt-hour)+(annualized cost of power supply)

For example, if the magnet is operated 10 hours a week for each of 52 weeks a year and electricity costs $0.1/kw-hour, then the electric power component of Cp would be calculated as follows:

$C_p$=(520 hours/year)×($0.1/kw-hour)=$52/kw-year

The annualized cost of the power supply is depreciated over the same time interval as the conductor material costs. The cost of a power supply is approximately proportional to the power consumption. Therefore, the power supply cost can be expressed as a cost per unit energy. For example, a power supply may cost $100/kilowatt. Depreciation over five years results in an annual cost of $20/kw-year. The $C_p$ coefficient is the sum of the power costs and depreciated power supply cost:

$C_p$=($52/kw-year)+($20/kw-year)=$72/kw-year

The total annual cost can actually be calculated over any time period. For example, by appropriately changing the coefficients $C_p$ and $C_m$, a total monthly cost or total daily cost can be calculated. For the present description, a total annual cost will be used. However, the total annual cost can be considered to be a specific manifestation of a total temporal cost, which is a total cost over any desired time period.

Most generally, the total annual cost is the sum of two monotonically increasing functions, $C_p P$ and $C_m Q$. One function relates the quantity of conductor material and a cost associated with such quantity, the other function relates the power consumption and a cost associated with power consumption. For example, the cost associated with power consumption is not necessarily directly proportional to the power consumption. Power costs per kilowatt-hour may include price-breaks for purchasing large amounts of power. Also, the cost of power supplies may not be directly proportional to power consumption. Therefore, $C_p$ may not be a constant, but rather a simple, monotonically increasing function of power consumption. Similarly, the cost associated with the quantity of conductor material may not be directly proportional to the quantity.

The total annual cost expression is considered to be only a function of the dimensionless ratios $\alpha$ and $\beta$. The fill factor $\lambda$, conductor material resistivity $\rho$, conductor material density d, bore radius $a_1$, and magnetic field $B_p$ are all preselected. Bore radius $a_1$, fill factor $\lambda$, conductor material, and field strength $B_p$ are termed the magnet input parameters. A global minimum for the total annual cost expression TAC $(\alpha,\beta)=C_p P+C_m Q$, can be found by plotting total annual cost versus $\alpha$ and $\beta$. Alternatively, $\alpha$ and $\beta$ can be determined using calculus techniques or any optimization software such as convex optimization, NPSOL, MATLAB, or Mathematica. Such techniques and software are known in the art. Typically, the minimum cost will have a relatively broad minimum in $\alpha$-$\beta$ parameter space defined by the parameters $\alpha$ and $\beta$.

Once optimal minimum cost values for $\alpha$ and $\beta$ are determined, the solenoidal electromagnet is completely defined and a solenoidal coil can be built in accordance with the selected values of α, β, λ, and $a_1$, and the conductor material. In most solenoidal magnets, it is best to use copper as the conductor material. Also, it is usually best to maximize λ. λ can be maximized by using wire having a square cross sectional shape and minimally thin insulation.

Figure 2:
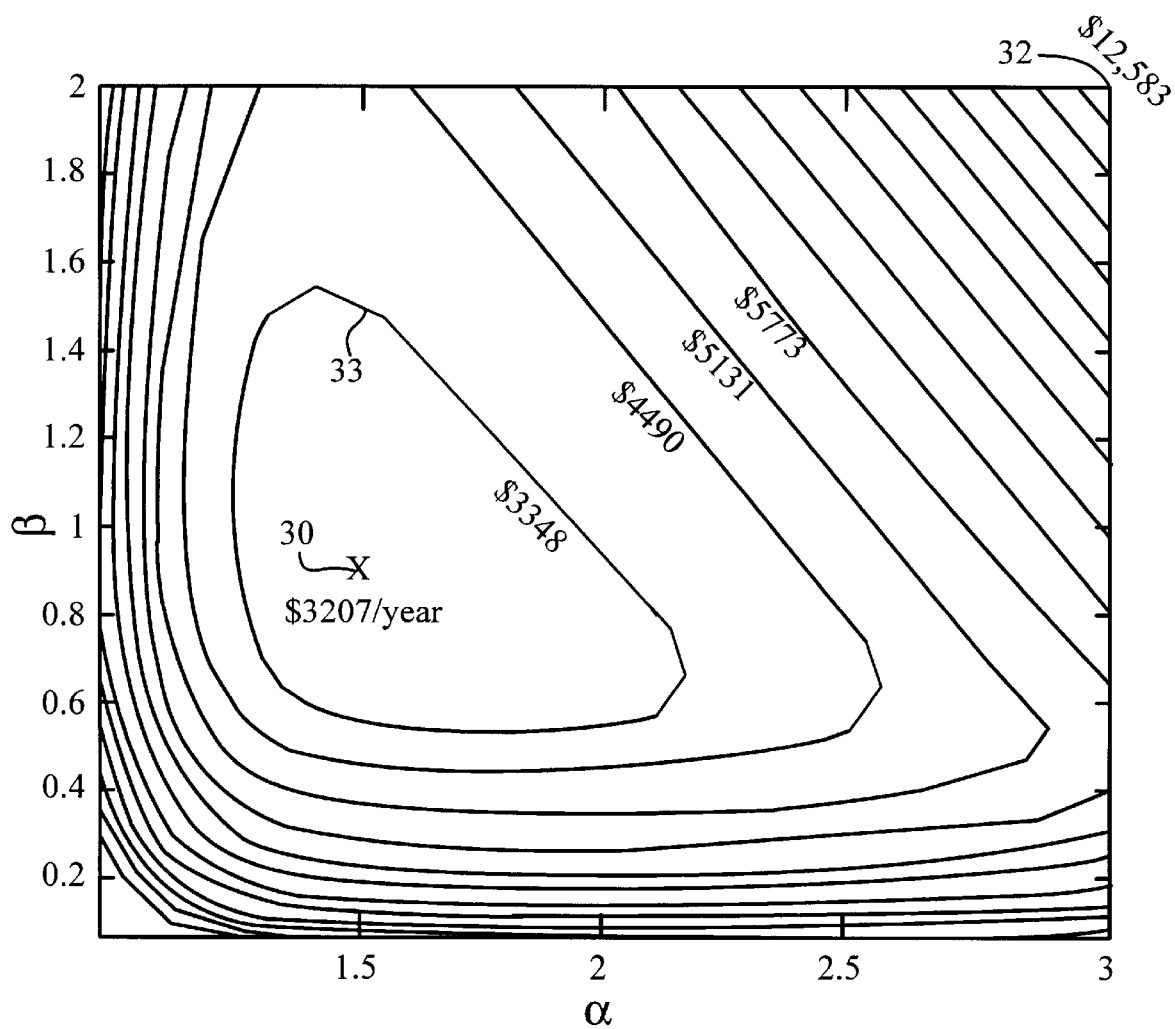
FIG. 2 is a cost contour plot calculated from a total annual cost expression for a solenoidal electromagnet.

FIG. 2 shows a cost contour plot in α-β parameter space calculated from the total annual cost expression for a solenoidal electromagnet made with copper wire and having a 19 centimeter bore radius and producing a 0.5 Tesla peak field in the center of the bore. λ is 0.9. The cost coefficients used were $C_m$=$2/kilogram (five year depreciation) and $C_p$=$52/kilowatt-year.

A minimum cost design 30 has α=1.6 and β=0.8 and is labeled in the graph. The minimum cost design 30 has a total annual cost of $3,207/year. This is much less than the total annual cost of the minimum power design 32 (α=3, β=2), which is $12,583/year.

Of course, both the minimum power design and minimum total annual cost design have the same bore size and magnetic field strength and use the same cost coefficients.

The minimum cost design is surrounded by a relatively large range of low-cost magnet designs. In other words, the cost minimum range in α-β parameter space is relatively broad. The cost minimum range is generally represented by the $3848 contour line 33.

Also, the minimum cost design 30 (=1.6, β=0.8) is far less massive than the minimum power design 32 (α=3, β=2). The minimum cost design weighs 433 kg compared to 5552 kg for the minimum power design. The minimum cost design therefore provides obvious portability and installation advantages over the minimum power design.

Table 1 shows the total annual costs and L/R time constants of minimum power and minimum total annual cost designs for different desired fields in solenoidal electromagnets having a 19 cm bore radius $a_1$.

TABLE 1

| Magnet | Field $B_p$ | Power | Mass | Cost/year | L/R |
| --- | --- | --- | --- | --- | --- |
| Min Cost | 0.5 T | 45 KW | 433 kg | $3,207 | 0.409 sec |
| Min Power | 0.5 T | 28 KW | 5552 kg | $12,583 | 2.20 sec |
| Min Cost | 0.75 T | 82 KW | 1002 kg | $6,252 | 0.55 sec |
| Min Power | 0.75 T | 64 KW | 5552 kg | $14,432 | 2.20 sec |

Another advantage of solenoidal magnets built in accordance with the present invention is that they have a relatively small outer radius (labeled $a_2$ 22 in FIG. 1). This reduces the cost of a readout magnet in a PMRI system in the case where the readout magnet is located around the polarizing solenoidal magnet. In the case where the readout coil is located outside the polarizing magnet, the inner radius of the readout magnet must be at least as large as the outer radius of the solenoidal magnet. Therefore a polarizing magnet with a small outer radius allows for a readout magnet with a small inner radius, reducing PMRI device cost.

A 19 cm bore, 0.5 Tesla solenoidal electromagnet is quite useful for providing the polarizing magnetic field for PMRI imaging of a human head. More generally, polarizing magnets with bore radii in the range of 12–25 cm are useful for PMRI imaging of human heads.

It is known in the art how to calculate the inductance L and resistance R for a solenoidal magnet. Therefore, it will be apparent to one skilled in the art how to calculate the L/R time constant for a specific solenoidal electromagnet. Reference can be made to F. W. Grover, *Inductance Calculations*, Dover, New York, N.Y. 1962 concerning inductance calculations.

The present invention includes solenoidal electromagnets for use in a PMRI device having values of α and β in accordance with the following inequalities:

$$\alpha\beta \leq 4,\ \alpha \geq 1.1,\ \text{and}\ \beta \geq 0.22.$$

Figure 3:
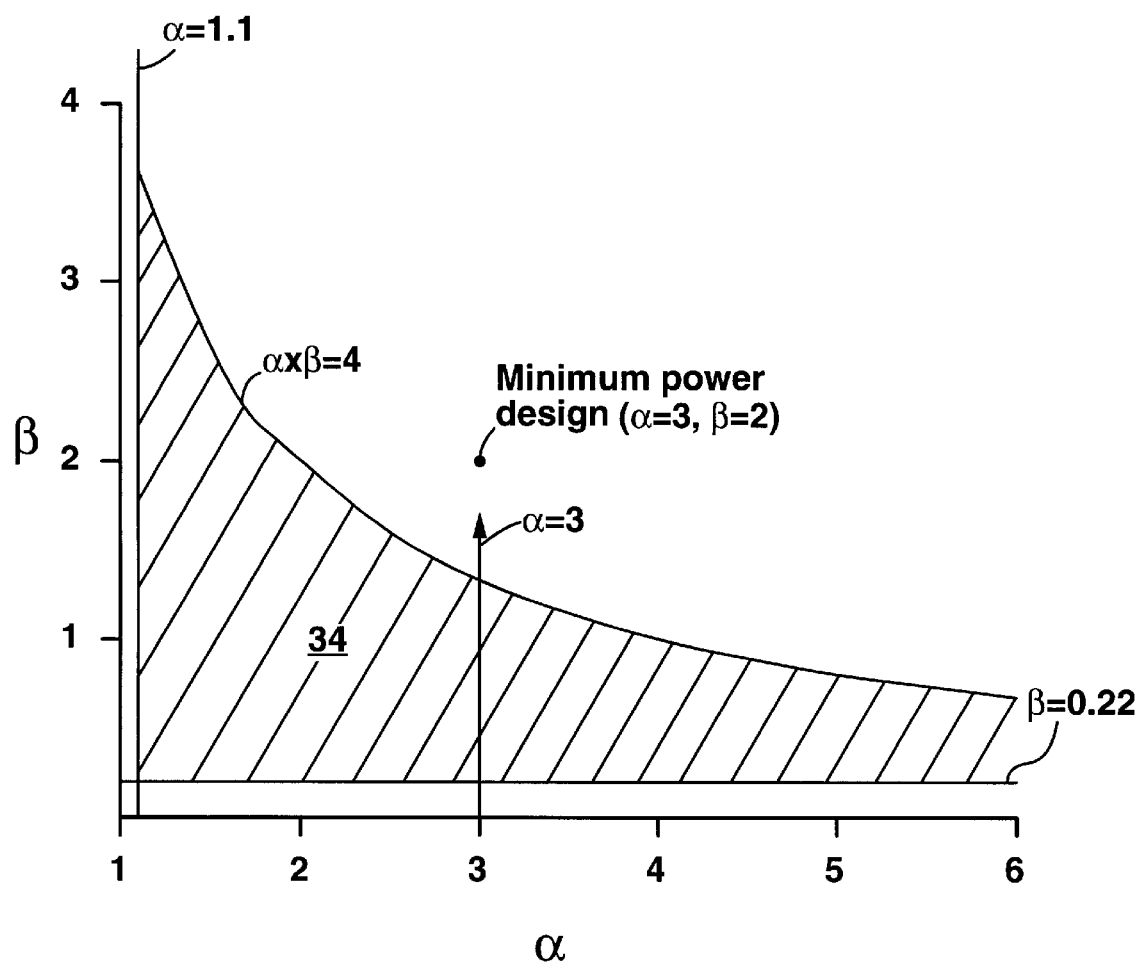
FIG. 3 is a plot of α-β parameter space which illustrates the magnet designs which are included in the present invention.

FIG. 3 shows a section of α-β parameter space. A shaded region 34 encompasses the magnet geometries that satisfy the above inequalities. It is noted that magnets with a α≧3.0 are rather impractical due to the large outer radius of the magnet. Therefore, magnets with α≦3.0 are preferred in the present invention.

Magnets with α≦3.0, β≦2.2, α≧1.25, and/or β≧0.3 in addition to the α≦4 limitation will generally have lower costs due to proximity to the total annual cost minimum. For reasonable values of the input magnet design parameters (bore radius $a_1$, fill factor λ, conductor material, and field strength $B_p$), the minimum cost design will be located roughly in the middle of the region defined by the inequalities α≦3.0, β≦2.2, α≧1.25, β≧0.3 and (αβ≦4. The preferred limitations are shown in the graph of FIG. 3.

It is noted that the present invention is preferably limited to magnets having a total annual cost that is less than the total annual cost of a minimum power magnet with the same input magnet design parameters (bore radius $a_1$, fill factor λ, conductor material, and field strength $B_p$). For the purpose of comparing the total annual cost of different magnets, it is important that the same depreciation interval (e.g. five years) be used for both magnets.

It has been found by the present inventor that magnets having values of α and β that satisfy the above inequalities have a relatively low total annual cost, relatively low L/R time constant, and relatively small outer radius 22. Therefore, such magnets are particularly useful in PMRI devices in which low total annual cost and low L/R values are desired. Of course, the above described method should be used to determine which specific values of α and β within the region 34 are best for a particular application.

Figure 4:
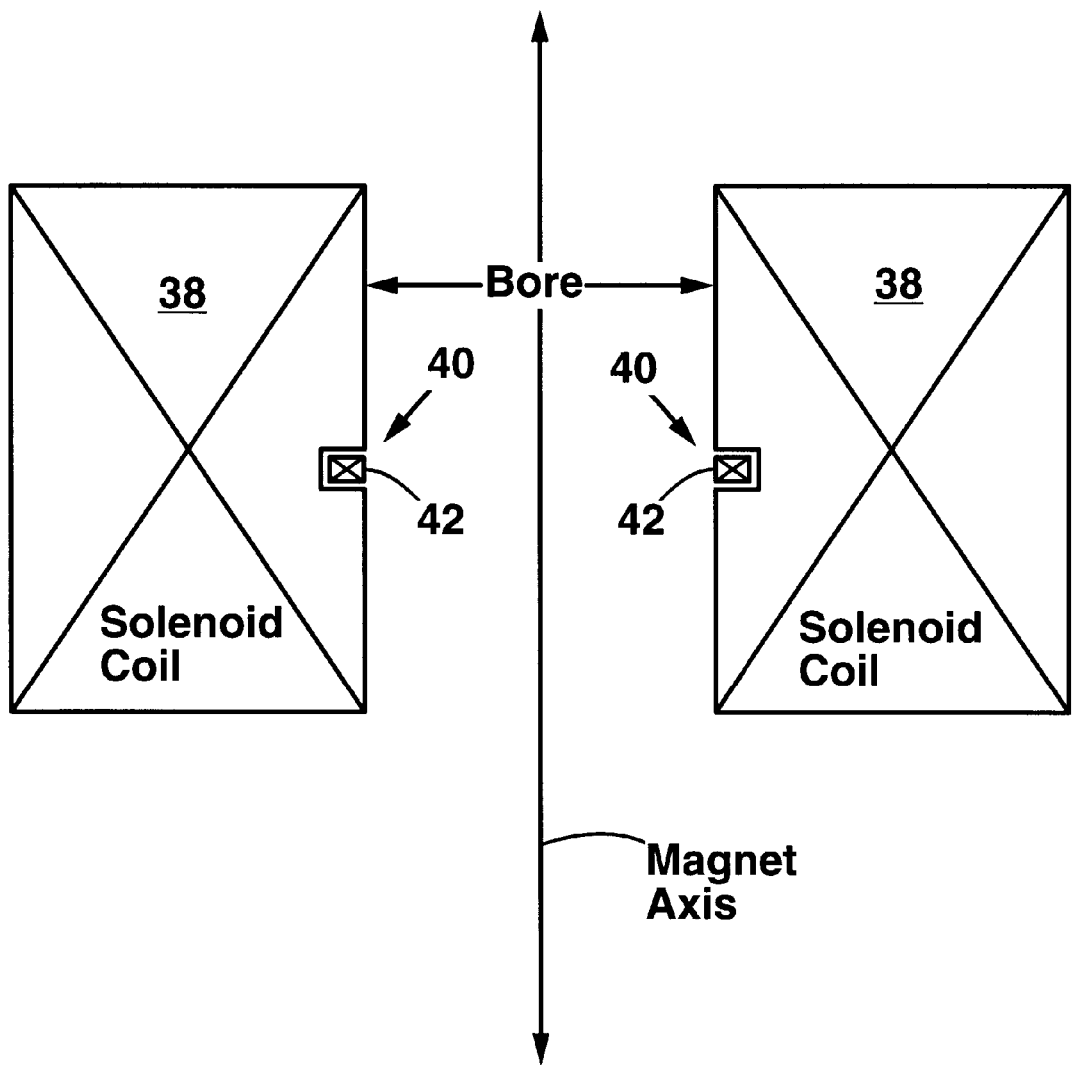
FIG. 4 shows a PMRI device according to the present invention.

FIG. 4 shows a prepolarized magnetic resonance imaging device (PMRI device) according to the present invention. The device has a solenoidal polarizing electromagnet 38 for providing a pulsed polarizing magnetic field. A readout magnet consisting of readout coils 42A, 42B provides a uniform readout magnetic field. Control electronics 44 control the operation of the polarizing electromagnet and readout magnet 42. The solenoidal polarizing electromagnet 38 has values of α and β in accordance with the inequalities αβ≦4, α≧1.1, and β≧0.22.

FIG. 4 also illustrates a feature of the present invention in which the solenoidal electromagnet 38 has an annular notch 40. Preferably, the annular notch 40 is shaped to admit the readout magnet coil 42A. Of course, more than one annular notch 40 can be provided for a number of readout coils. The use of a notch to accept a readout coil in the solenoidal electromagnet maintains a constant inner bore diameter along a magnet axis 45.

The annular notch 40 can also be designed to improve the magnetic field homogeneity of the magnetic field produced by the magnet 38. If designed properly and symmetrically located in the middle of the solenoid, the notch tends to 'flatten' the magnetic field in the central region. Reference can be made to *Solenoid Magnet Design* by D. B. Montgomery, Robert Krieger Publishing Company, Malabar, Fla. 1980, concerning the use of annular notches to improve the magnetic field homogeneity of solenoidal electromagnets.

An important concern in magnet design is the amount of heating which occurs when the magnet is operated. In many applications it is desirable to minimize the amount of heating. The amount of heating can be described in terms of a temperature rise rate (dT/dt). The temperature rise rate is approximately related to the power consumption of the magnet and the quantity Q and heat capacity of the conductor material according to the following equation:

$$\frac{dT}{dt} = \frac{\text{Power Consumption}}{Q \times \text{Heat Capacity}}.$$

It is noted that the heat capacity must be expressed in units compatible with the units in which Q is expressed. For example, the quantity of conductor material can be expressed in terms of mass (substitute M for Q) in which case the heat capacity is expressed in terms of specific heat.

It has been shown that the power consumption and the quantity Q of conductor material are functions of the dimensionless shape ratios $\alpha$ and $\beta$ (provided that $\lambda$, $a_1$, $B_p$ and conductor material are preselected). The heat capacity per unit conductor material is therefore also preselected. Therefore, the temperature rise rate dT/dt is a function of $\alpha$ and $\beta$. Temperature rise rate contours can be drawn in $\alpha$-$\beta$ parameter space.

Figure 5:
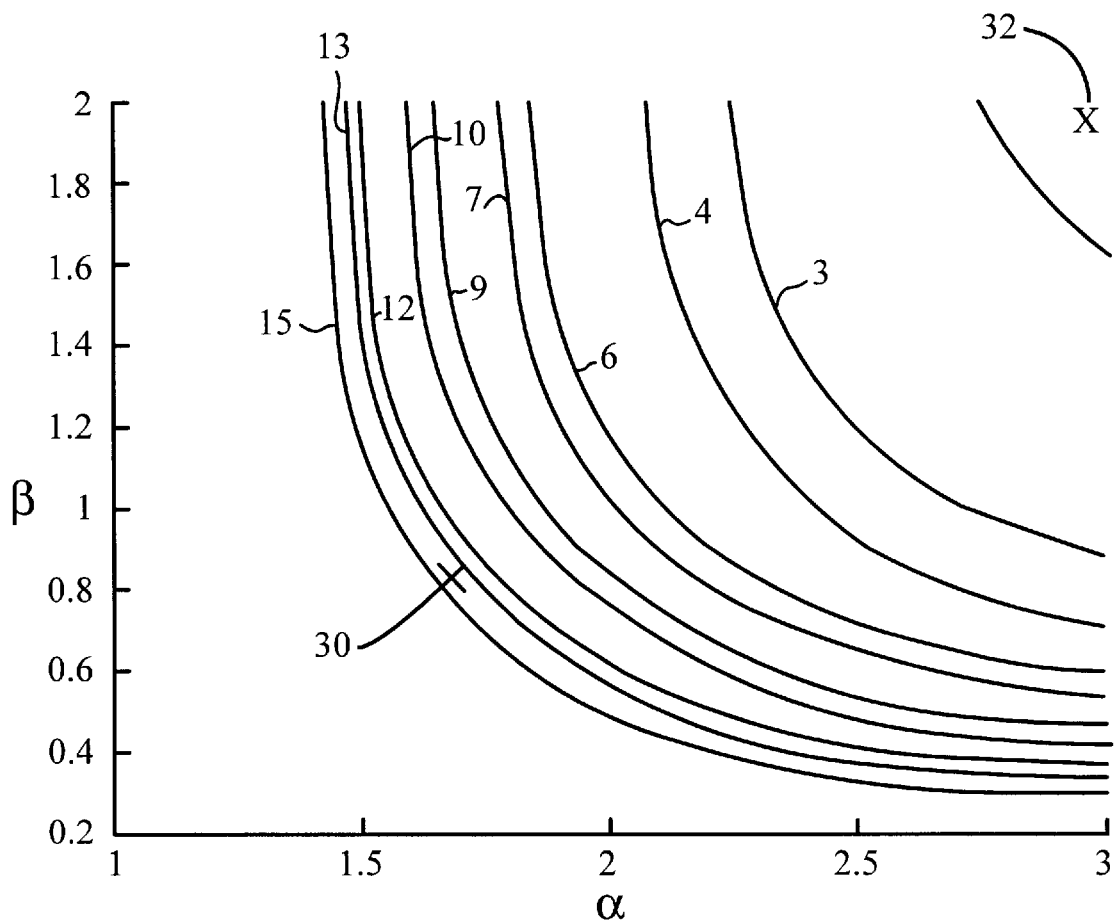
FIG. 5 is a plot of temperature rise rate contours in α-β parameter space.

FIG. 5 shows temperature rise rate contours in $\alpha$-$\beta$ parameter space for 19 cm bore, 0.5 Tesla, $\lambda$=0.9 copper conductor solenoidal magnets. An 'X' indicates the minimum cost design 30. The numerals in the contours indicate the temperature rise rate in degrees Celsius per minute. It can be seen that the minimum total annual cost design ($\alpha$=1.6, $\beta$=0.8) has a relatively high temperature rise rate of about 14° C./minute compared to the temperature rise rate of the minimum power design ($\alpha$=3, $\beta$=2) which is about 2° C./minute. This is because the minimum cost design has a relatively high power consumption and a relatively low mass compared to the minimum power design.

The present invention includes a method of building a magnet with a reduced temperature rise rate. A temperature rise rate constraint is defined according to the equation:

$$\frac{\text{Power Consumption}}{Q \times \text{Heat Capacity}} \leq \text{Maximum} \frac{dT}{dt}.$$

The power consumption and quantity of conductor material Q are dependent upon $\alpha$ and $\beta$. Therefore, the temperature rise rate constraint imposes constraints on the values of $\alpha$ and $\beta$. Therefore, the temperature rise rate constraint can be plotted in $\alpha$-$\beta$ parameter space. The lowest cost magnet that satisfies the temperature rise rate constraint can be found by combining the total annual cost contours with the plot of the temperature rise rate constraint. More generally, temperature rise rate contours can be plotted in $\alpha$-$\beta$ space, with each contour corresponding to a different temperature rise rate.

Figure 6:
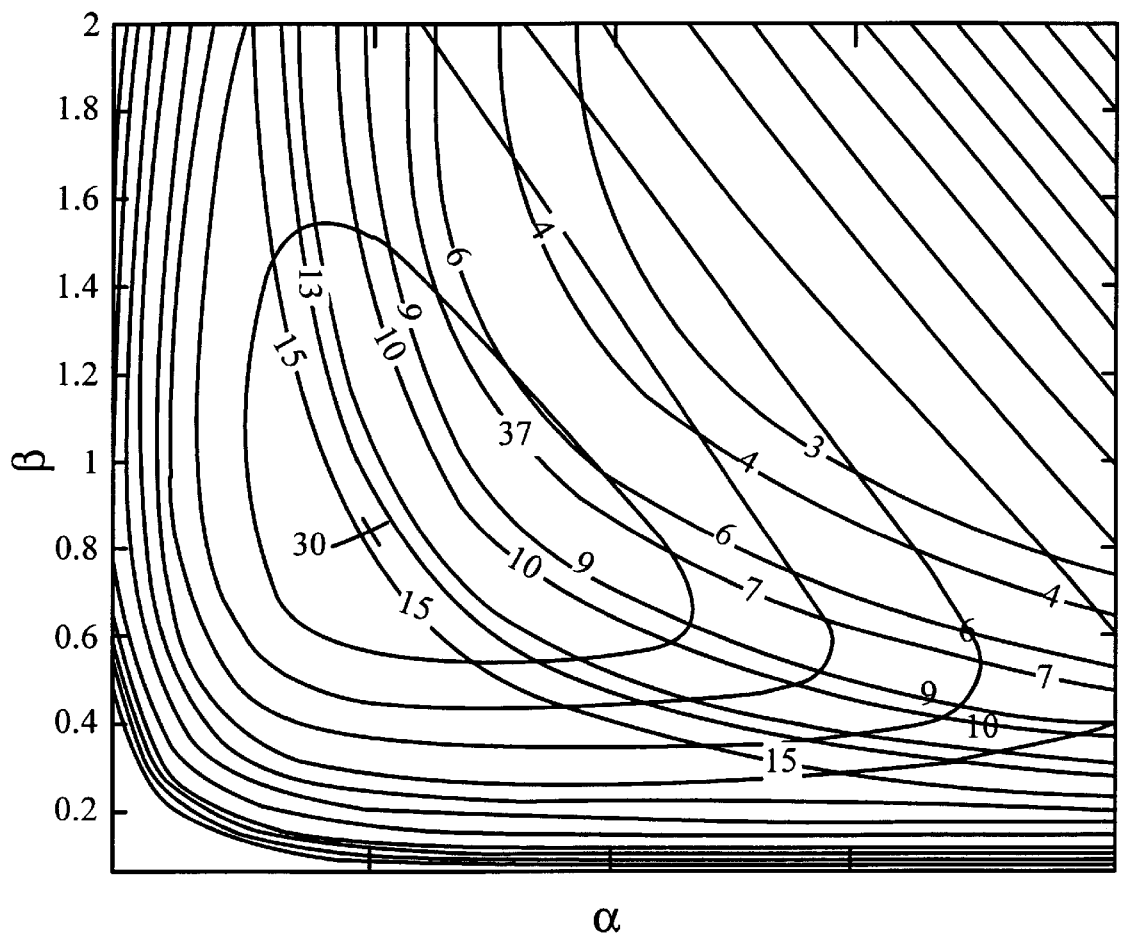
FIG. 6 is a plot of both temperature rise rate contours and cost contours in α-β parameter space.

FIG. 6 shows a combined plot of temperature rise rate contours and total annual cost contours for magnets with 19 cm radius bores and producing 0.5 Tesla fields. The numerals in the temperature rise rate contours indicate the temperature rise rate in degrees Celsius per minute. This combined plot allows one to select different solenoid designs with different temperature rise rates and different costs, but identical operating characteristics.

The large area of the minimum cost region 33 (in FIG. 2) in $\alpha$-$\beta$ space can be exploited to reduce the temperature rise rate with a small increase in magnet cost. For example, a magnet with $\alpha$=1.7 and $\beta$=1.1 has a temperature rise rate of 8° C./minute (almost a 50% reduction from the minimum cost design 30) and a cost only 7% greater than the minimum cost design 30. More generally, a magnet design located in the region generally designated by 37 will have a relatively small increase in cost but a large decrease in temperature rise rate compared to the minimum cost design 30.

Combined plots such as FIG. 6 can therefore be used to select designs that judiciously balance the competing factors of low cost and slow temperature rise rate for a particular application.

It is noted that temperature rise rate issues are largely irrelevant if the magnet is water-cooled. The present invention includes PMRI devices with water-cooled solenoidal magnets.

It will be clear to one skilled in the art that the above embodiment may be altered in many ways without departing from the scope of the invention. Accordingly, the scope of the invention should be determined by the following claims and their legal equivalents.

What is claimed is:

1. A prepolarized magnetic resonance imaging device comprising:
   a) a solenoidal polarizing electromagnet with dimensionless shape ratios $\alpha$ and $\beta$ in accordance with the following inequalities: $\alpha\beta \leq 4$, $\alpha \geq 1:1$, and $\beta \geq 0.22$;
   b) a readout magnet for providing a uniform magnetic field for analyzing nuclear spin polarization;
   c) control electronics for controlling the readout magnet and polarizing electromagnet.

2. The prepolarized magnetic resonance imaging device of claim 1 wherein the solenoidal polarizing electromagnet has $\alpha \leq 3.0$.

3. The prepolarized magnetic resonance imaging device of claim 1 wherein the solenoidal polarizing electromagnet has $\beta \leq 2.2$.

4. The prepolarized magnetic resonance imaging device of claim 1 wherein the solenoidal polarizing electromagnet has $\alpha \geq 1.25$.

5. The prepolarized magnetic resonance imaging device of claim 1 wherein the solenoidal polarizing electromagnet has $\alpha \leq 0.3$.

6. The prepolarized magnetic resonance imaging device of claim 1 wherein the solenoidal polarizing electromagnet has a total annual cost less than the total annual cost of a solenoidal magnet with $\alpha$=3 and $\beta$=2 and the same conductor material, bore radius $a_1$, field strength $B_p$, and fill factor $\lambda$ as the solenoidal polarizing electromagnet.

7. The prepolarized magnetic resonance imaging device of claim 1 wherein the solenoidal polarizing electromagnet has at least one annular notch for admitting the readout coil.

8. The prepolarized magnetic resonance imaging device of claim 1 wherein the solenoidal polarizing electromagnet has at least one annular notch located such that a polarizing magnetic field is substantially homogeneous.

9. The prepolarized magnetic resonance imaging device of claim 1 wherein the solenoidal polarizing electromagnet has a bore radius $a_1$ in the range of 12–25 centimeters.

10. A method of producing a solenoidal electromagnet comprising the steps of:
   a) selecting a conductor material whereby a cost per unit of the conductor material per unit time, $C_m$, is determined;
   b) defining a quantity expression substantially equivalent to:

$$Q = \lambda a_1^3 \beta(\alpha^2 - 1)$$

where Q is a total quantity of conductor material in the solenoidal magnet, $\lambda$ is a fill factor, $a_1$ is a bore radius of the solenoid, and $\alpha$ and $\beta$ are dimensionless shape ratios;

c) defining a power consumption expression substantially equivalent to:

$$P = \left(\frac{\rho}{\lambda}\right)\left(\frac{B_p}{\mu_o}\right)^2 a_1 \left(\frac{1}{G(\alpha,\beta)}\right)^2$$

where P is a power consumption of the solenoid, $\rho$ is a resistivity of the conductor material, $B_p$ is a polarizing magnetic field to be produced, $\mu_o$ is the permeability of free space, and $G(\alpha,\beta)$ is a Fabry factor;

d) defining a cost per unit of electrical power per unit time, $C_p$;

e) defining a total temporal cost expression of the form:

Total temporal cost=$C_m Q + C_p P$;

f) determining values for $\alpha$ and $\beta$ such that the total temporal cost expression is substantially minimized;

g) building a solenoidal magnet in accordance with the $\alpha$ and $\beta$ values determined in step (f).

11. The method of claim 10 wherein the quantity expression has the form:

Quantity of conductor material=Q $\lambda a_1^3 \beta(\alpha^2-1)$, where $\lambda$ is a fill factor and $a_1$ is a bore radius.

12. The method of claim 11 wherein the quantity expression has the form:

Mass=M=$(2\pi\lambda d) a_1^3 \beta(\alpha^2-1)$, where d is a density of the conductor material; whereby the quantity expression expresses the quantity of conductor material in units of mass.

13. The method of claim 10 wherein the power consumption expression has the form:

$$\text{Power consumption} = P = \left(\frac{\rho}{\lambda}\right)\left(\frac{B_p}{\mu_o}\right)^2 a_1 \left(\frac{1}{G(\alpha,\beta)}\right)^2,$$

where $G(\alpha,\beta)$ is a Fabry factor, $\lambda$ is a fill factor, $\rho$ is the resistivity of the conductor material, $B_p$ is the desired magnetic field, and $\mu_o$ is the permeability of free space.

14. The method of claim 10 further comprising the steps of:

1) defining a maximum temperature rise rate constraint;
2) determining values for $\alpha$ and $\beta$ such that the total annual cost expression is substantially minimized given the maximum temperature rise rate constraint defined in step (1).

15. The method of claim 10 wherein step (f) comprises the step of plotting values of the total temporal cost for a number of $\alpha$ and $\beta$ values sufficient to produce cost contours in $\alpha$-$\beta$ parameter space.

16. A method of producing a solenoidal electromagnet comprising conductor material, the method comprising the steps of:

a) defining a cost per unit of electrical energy, $C_p$;
b) selecting a bore radius, $a_1$;
c) selecting a desired magnetic field, $B_p$;
d) selecting a fill factor $\lambda$ for the solenoidal electromagnet;

e) selecting the conductor material whereby a cost per unit of the conductor material per unit time, $C_m$, is determined and a resistivity $\rho$ of the conductor material is determined;

f) defining a quantity expression substantially equivalent to:

Q=$\lambda a_1^3 \beta(\alpha^2-1)$ where Q is a total quantity of conductor material in the solenoidal magnet, and $\alpha$ and $\beta$ are dimensionless shape ratios;

g) defining a power consumption expression substantially equivalent to:

$$P = \left(\frac{\rho}{\lambda}\right)\left(\frac{B_p}{\mu_o}\right)^2 a_1 \left(\frac{1}{G(\alpha,\beta)}\right)^2$$

where P is a power consumption of the solenoid, $\rho$ is a resistivity of conductor material in the solenoid, $\mu_o$ is the permeability of free space, and $G(\alpha,\beta)$ is a Fabry factor;

h) defining a total temporal cost expression of the form:

Total temporal cost=$C_m Q + C_p P$;

i) determining values for $\alpha$ and $\beta$ such that the total temporal cost expression is substantially minimized;

j) building a solenoidal coil in accordance with the $\alpha$ and $\beta$ values determined in step (i).

17. The method of claim 16 wherein the quantity expression has the form:

Mass=M=$(2\pi\lambda d) a_1^3 \beta(\alpha^2-1)$, where d is a density of the conductor material; whereby the quantity expression expresses the quantity of conductor material in units of mass.

18. The method of claim 16 wherein the power consumption expression has the form:

$$\text{Power consumption} = P = \left(\frac{\rho}{\lambda}\right)\left(\frac{B_p}{\mu_o}\right)^2 a_1 \left(\frac{1}{G(\alpha,\beta)}\right)^2,$$

where $G(\alpha,\beta)$ is a Fabry factor and $\mu_o$ is the permeability of free space;

19. The method of claim 16 further comprising the steps of:

1) defining a maximum temperature rise rate constraint;
2) determining values for $\alpha$ and $\beta$ such that the total annual cost expression is substantially minimized given the maximum temperature rise rate constraint defined in step (1).

20. The method of claim 16 wherein step (i) comprises the step of plotting values of the total temporal cost for a number of $\alpha$ and $\beta$ values sufficient to produce cost contours in $\alpha$-$\beta$ parameter space.

* * * * *